(12) United States Patent
Mizuno et al.

(10) Patent No.: US 6,466,451 B2
(45) Date of Patent: Oct. 15, 2002

(54) ELECTRIC CONNECTION BOX

(75) Inventors: Fumiaki Mizuno, Nagoya (JP); Shigeki Yamane, Nagoya (JP); Keizo Ikeda, Nagoya (JP); Takahiro Onizuka, Nagoya (JP)

(73) Assignees: Autonetworks Technologies, LTD, Nagoya (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/760,732

(22) Filed: Jan. 17, 2001

(65) Prior Publication Data

US 2001/0012708 A1 Aug. 9, 2001

(30) Foreign Application Priority Data

Jan. 20, 2000 (JP) ......................................... 2000-012204

(51) Int. Cl.[7] .............................................. H05K 7/18
(52) U.S. Cl. ....................................... 361/796; 174/260
(58) Field of Search ............................... 174/255–261, 174/250; 361/796–802

(56) References Cited

U.S. PATENT DOCUMENTS

| 3,632,915 | A | * | 1/1972 | Kramer ..................... 200/48 R |
| 4,692,842 | A | * | 9/1987 | Joly et al. ................... 361/413 |
| 5,289,349 | A |   | 2/1994 | Nishino |
| 5,399,806 | A | * | 3/1995 | Olson ........................... 174/53 |
| 5,652,462 | A |   | 7/1997 | Matsunaga et al. |

FOREIGN PATENT DOCUMENTS

| DE | 196 27 858 A1 | 1/1998 |
| GB | 2 161 333 A | 1/1986 |
| JP | A-10-116960 | 5/1998 |
| JP | A-10-126963 | 5/1998 |

* cited by examiner

Primary Examiner—Kamand Cuneo
Assistant Examiner—Jeremy Norris
(74) Attorney, Agent, or Firm—Oliff & Berridge PLC

(57) ABSTRACT

A MOSFET 150 composed of a bare tip is surface mounted on a bus bar 141 disposed on the surface of an insulated plate 140, and the MOSFET 150 is circuit connected to a bus bar substrate 14 or to a printed circuit board 145 disposed integrally on the bus bar substrate 14 through a wire 151. In the bus bar 141, there is disposed a heat radiating member 155 which is used to radiate heat generated from the MOSFET 150 into an external space.

19 Claims, 3 Drawing Sheets

ELECTRIC CONNECTION BOX

BACKGROUND OF THE INVENTION

The present invention relates to an electric connection box which includes an insulated case and a bus bar substrate stored in the interior portion of the insulated case.

An electric connection box is used to branch connect a wireharness for a car to various electric parts; specifically, with use of the electric connection box, the branch connecting points of the wireharness can be collected together at a given portion to thereby be able to arrange the reasonable and economical wiring for the branch connecting points. The electric connection box is structured such that a bus bar substrate composed of an insulating plate and a band-shaped metal plate disposed on the insulating plate is stored in the interior portion of an insulated case. With the enhanced density of the wireharness, there have been developed various kinds of electric connection boxes according to types of cars or according to uses. Also, a mechanical relay, which serves as switching means for turning on/off a given electronic circuit, is carried on the outer surface of the insulated case as the need arises.

FIG. 5 is an exploded perspective view of the main portions of an electric connection box with such mechanical relay carried thereon. In this electric connection box, a relay socket 104, which is disposed on the outer surface of an insulated case 101, is connected through relay terminals 105 to a plurality of tab terminals 103 provided on and projected from the upper surface of a bus bar substrate 102 which is stored in the interior portion of the insulated case 101, and a mechanical relay 106 is mounted on the relay socket 104.

By the way, in the case of the bus bar substrate 102, to mount the mechanical relay 106 on the relay socket 104, the plurality of tab terminals 103, which are respectively formed by bending the leading end portions of a plurality of (for example, three) bus bars, must be disposed such that they are situated adjacently to each other. Due to this, there arises the need that the plurality of bus bars must be divided into a plurality of (at least two) layers in order to be able to prevent the bus bars from interfering with each other, which unfavorably results in the complicated structure of the bus bar substrate 102. Owing to this, the manufacturing process of the bus bar substrate 102 is complicated to thereby put a limit on reduction of the manufacturing cost of the product (that is, the electric connection box).

Also, in the field of cars, recently, there has been popular a tendency that cars are manufactured in large kinds and in small lots and thus, in some cases, an on/off control circuit using the mechanical relay 106 must be changed so as to have a circuit configuration which requires different types of bus bars depending on the kinds of cars. In such case, there is newly required an expensive metal mold which is used to mold these bus bars. This not only puts a limit on reduction of the product (electric connection box) manufacturing cost but also requires the time for manufacturing the new metal mold to thereby delay the start of manufacture of a new product (electric connection box)

By the way, there is also known a structure in which electronic circuit units each including a control circuit disposed upwardly of the bus bar substrate 102 are disposed in layers or stages; and, by configuring an on/off control circuit using the mechanical relay 106 on such electronic circuit unit, there can be avoided the need to change the shapes of the bus bars in the bus bar substrate 102. However, in this case, not only there is required a new print wiring substrate for configuring the electronic circuit unit but also there arises the need to change a connector which is used to connect together the bus bar substrate 102 and the electronic circuit unit; that is, substantially, there arises a similar problem found in the previously described conventional structure.

SUMMARY OF THE INVENTION

The present invention aims at eliminating the drawbacks found in the above-mentioned conventional electric connection boxes. Accordingly, it is an object of the invention to provide an electric connection box which not only can simplify the structure of a bus bar substrate to thereby facilitate the assembling of the bus bar substrate but also is able to easily cope with a change in a circuit configuration.

In attaining the above object, according to a first aspect of the invention, there is provided an electric connection box, comprising an insulated case and a bus bar substrate including a bus bar circuit thereon and stored in the interior portion of the insulated case, the bus bar circuit being composed of an insulated plate and a bus bar formed of a metal plate and disposed on at least the surface of the insulated plate, wherein the present electric connection box further comprises a switching element having a plurality of external terminals, and the switching element is incorporated into the bus bar circuit through the external terminals in such a state that the switching element is surface mounted on the bus bar substrate.

According to this structure, since the switching element to be incorporated into the bus bar circuit is surface mounted on the bus bar substrate, supply of a drive voltage to the switching element as well as input and output of an electric signal between the switching element and bus bar substrate can be carried out through connecting means such as a wire which is disposed on the surface of the bus bar substrate. Thanks to this, there is avoided the need to raise a tab terminal for relay connection up from the bus bar as in the conventional electric connection box, which not only can simplify the structure of the bus bar substrate to thereby facilitate the assembling of the bus bar substrate but also allows the bus bar substrate and thus the electric connection box to cope with a change in a circuit configuration easily.

Also, according to a second aspect of the invention, in an electric connection box as set forth in the first aspect of the invention, the switching element is surface mounted on the bus bar of the bus bar substrate.

According to this structure, even in case where the switching element is an element which generates heat, heat generated by the switching element is transmitted directly to the metal-made bus bar which is high in thermal conductivity and is then radiated into the external space through the bus bar. Thanks to this, excessive heat generation by the switching element can be prevented more positively, which makes it possible to realize an electric connection box showing excellent operation reliability.

Also, according to a third aspect of the invention, in an electric connection box as set forth in the second aspect of the invention, the switching element includes an external terminal on the mounting surface thereof and this external terminal is connected directly to the bus bar.

According to this structure, a wiring member such as a wire can be omitted and the external terminal on the mounting surface of the switching element can be connected to the bus bar positively, thereby being able to realize an electric connection box which has a high heat radiating effect and also shows excellent operation reliability.

And, according to a fourth aspect of the invention, in an electric connection box as set forth in the second or third aspect of the invention, the bus bar includes heat radiating means which is used to radiate heat generated from the switching element into the external space.

According to this structure, Joule heat generated from the switching element is radiated into the external space through the heat radiating means. This can enhance the heat radiating property of the switching element, thereby being able to realize an electric connection box showing more excellent operation reliability.

Also, according to a fifth aspect of the invention, in an electric connection box as set forth in the fourth aspect of the invention, the heat radiating means is composed of a heat radiating member including a fin and at least part of the fin is exposed to the outside of the insulated case.

According to this structure, Joule heat generated from the switching element is effectively radiated into the external space of the insulated case through the fin having a large heat radiating area. This can enhance the heat radiating property of the switching element further, thereby being able to realize an electric connection box showing still more excellent operation reliability.

And, according to a sixth aspect of the invention, in an electric connection box as set forth in any one of the first to fifth aspect of the invention, the switching element is structured such that at least part of the external terminals are connected to the bus bar substrate through wires.

According to this structure, supply of a drive voltage to the switching element to be surface mounted onto the bus bar substrate as well as input and output of an electric signal between the switching element and bus bar substrate are carried out through the wires. This not only can simplify the structure of the bus bar substrate to thereby facilitate the assembling of the bus bar substrate but also allows the bus bar substrate and thus the electric connection box to cope with a change in a circuit configuration easily.

Also, according to a seventh aspect of the invention, in an electric connection box as set forth in the sixth aspect of the invention, at least part of the wire, on the bus bar substrate, is sealed by an insulated coating member.

According to this structure, since the wire is restricted on the bus bar substrate side, when a car starts or stops suddenly, the vibrations of the wire with respect to the bus bar substrate can be controlled. This can prevent the wire from being cut, thereby being able to realize an electric connection box showing excellent operation reliability. Especially, in case where the insulated coating member has elasticity or visco-elasticity, the vibrations of the wire applied when a car starts or stops suddenly can be effectively absorbed by the insulated coating member, which makes it possible to effectively reduce stresses caused in the wire.

And, according to an eighth aspect of the invention, in an electric connection box as set forth in any one of the first to seventh aspects of the invention, a print circuit is integrally disposed on part of the surface of the bus bar substrate and at least part of the external terminals of the switching element are connected to the print circuit.

According to this structure, input and output of an electric signal between the switching element and print circuit are carried out through the connecting means such as a wire. This not only can simplify the structure of the bus bar substrate to thereby facilitate the assembling of the bus bar substrate but also allows the bus bar substrate and thus the electric connection box to cope with a change in a circuit configuration easily.

DETAILED DESCRIPTION OF THE PREFERRED EMBODIMENTS

Figure 1:
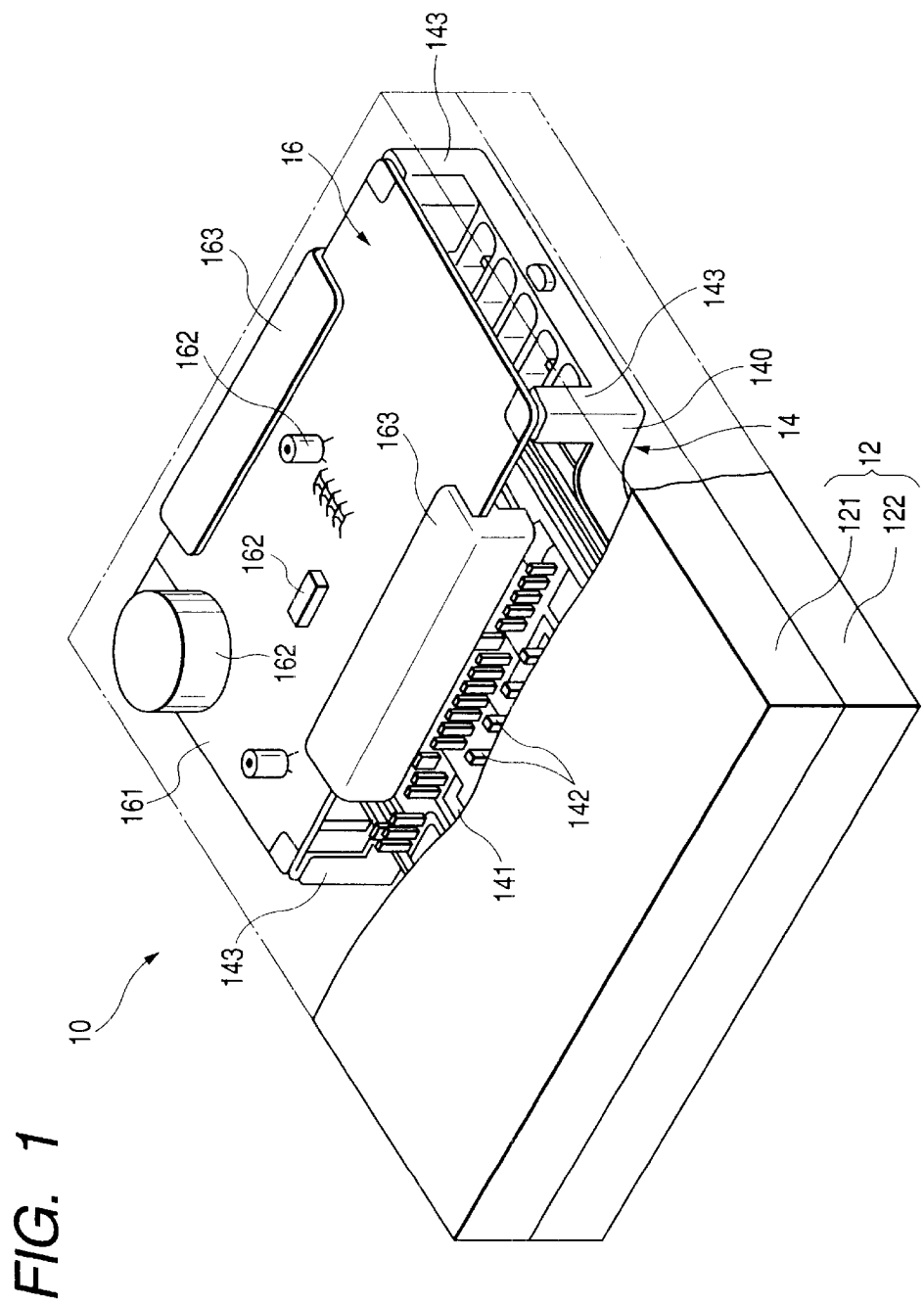
FIG. 1 is a partially cutaway perspective view of the main portions of the structure of an electric connection box according to an embodiment of the invention.

Now, FIG. 1 a partially cutaway perspective view of the main portions of the structure of an electric connection box according to an embodiment of the invention. In FIG. 1, an electric connection box 10 comprises an insulated case 12 composed of a is rectangular-shaped upper case 121 and a rectangular-shaped lower case 122, a bus bar substrate 14 which forms a wiring unit and is stored in the interior portion of the insulated case, and an electronic circuit unit 16 similarly stored in the interior portion of the insulated case and carried on the bus bar substrate 14.

The insulated case 12 is formed of insulating material such as synthetic resin and is structured such that the upper and lower cases 121 and 122 are separably assembled together. By the way, on the outer surface of the insulated case 12, there are disposed one or more connector housings which are not shown.

The bus bar substrate 14 is structured in the following manner: that is, on a rectangular-shaped insulated plate 140 formed of synthetic resin, there is disposed an elongated bus bar 141 which is formed by punching out a metal plate using a metal mold; and, at given positions of the insulated plate 140, there are disposed tab terminals 142 in such a manner that they stand erect from the insulated plate 140. By the way, in the present embodiment, there are used a plurality of bus bars 141 and, specifically, the bus bars 141 are disposed on the insulated plate 140 such that they are divided into a plurality of layers or stages; and, at least in a certain area, the bus bar 141 located in the top layer is disposed in such a manner that it is exposed to the surface of the insulated plate 140. Also, the tab terminals 142 include two kinds of tab terminals; that is, tab terminals which are formed by bending the leading ends of the bus bars 141 at right angles, and tab terminals which are formed independent of the bus bars 141. The structure of the bus bar substrate 14 will be described again later.

The electronic circuit unit 16 can be structured in the following manner: that is, a plurality of electronic parts 162 are carried on a rectangular-shaped printed wiring substrate 161 including a given wiring pattern to thereby complete a given electronic circuit such as a control circuit. The electronic circuit unit 16, according to the present embodiment, is mounted on support members 143 respectively provided on and projected from the insulated plate 140 by mounting means such as screwing means and is electrically connected to the bus bar substrate 14 through two connectors 163 which are mounted on the two mutually opposing end edges of the printed wiring substrate 161.

Figure 2:
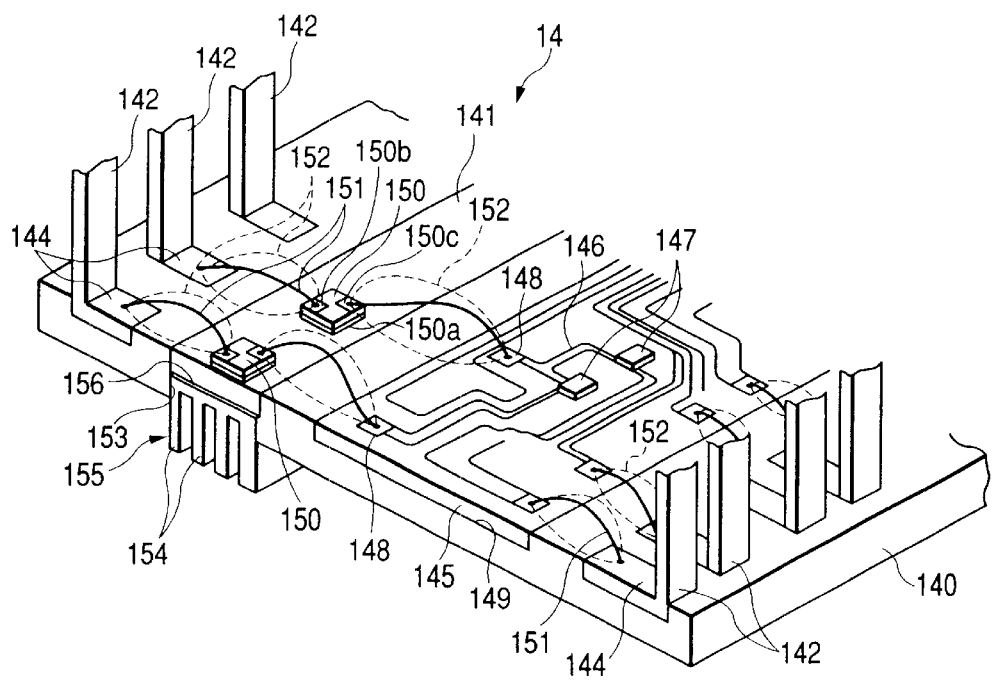
FIG. 2 is a perspective view of the main portions of a bus bar substrate forming the electric connection box shown in FIG. 1.

Now, FIG. 2 shows the main portions of the bus bar substrate 14. In the insulated plate 140 which forms a part of the bus bar substrate 14, at a position which is nearer to the left end of the plate 140 than the center thereof, there is disposed an elongated top-layer bus bar 141 in such a manner that the surface thereof is exposed; and, in the two right and left end portions of the insulated plate 140, there are mounted a plurality of tab terminals (connecting terminals) independent of the bus bars 141 in such a manner that they stand erect along the elongated (longitudinal) direction of the bus bars 141. These tab terminals 142 are embedded in the insulated plate 140 in such a manner that the surfaces of their base portions 144 bent at right angles to their respective erect-shaped terminal main bodies are exposed. Also, on the insulated plate 140, between the bus bars 141 and a group of tab terminals 142 on the right end portion of the plate 140, there is disposed a printed circuit board 145 with the surface thereof exposed.

The bus bars 141 and the tab terminals 142 of the two right and left portions are formed integrally with the insulated plate 140, for example, by molding. Also, the printed circuit board 145 is structured in the following manner: that is, a given wiring pattern 146 is formed on the surface of the printed circuit board 145; a plurality of electronic parts 147 such as tips are mounted on the wiring pattern 146; and, two lands (connecting electrodes) 148 are respectively formed in the two end portions of the wiring pattern 146. The thus structured printed circuit board 145 is mounted integrally into a recessed portion 149, which is formed in the insulated plate 140, by proper mounting means such as screwing means or bonding means.

Also, on the surface of each of the bus bars 141, there is mounted a plurality of MOSFETs (Metal Oxide Semiconductor Field Effect Transistors) 150. This MOSFET 150 is composed of a bare tip: specifically, on the tip back surface which provides a mounting surface of the MOSFET 150 with respect to the bus bar 141, there is formed a drain terminal 150a which is an external terminal; and, on the tip front surface, there are formed a source terminal 150b and a gate terminal 150c which are respectively external terminals. When the MOSFET 150 made of the thus structured bare tip is mounted on the surface of the bus bar 141 by conductive adhesives or by soldering, the drain terminal 150a thereof is electrically connected to the bus bar 141. By the way, although not shown, the MOSFET 150 is covered with insulating coating material such as silicone and is thereby provided with insulating and humidity-proof properties.

Also, the source terminal 150b and gate terminal 150c of the MOSFET 150 are electrically connected (bonded) to the base portions 144 of the tab terminals 142 and the lands 148 of the printed circuit board 145 by connecting means, that is, conductive wires 151 which are made of gold wires or nickel wires. These wires 151 are disposed by wire bonders of a thermal pressure bonding type in such a manner that the wires 151 have given clearances with respect to the surface of the bus bar substrate 14; and, the wires 151, including their connecting portions with respect to the tab terminals 142 and lands 148, are sealed onto the bus bar substrate 14 by insulated coating members 152 formed of elastic material such as silicone, so that they can be bonded and fixed to the bus bar substrate 14.

Due to the above arrangement, even when a car starts suddenly or stops suddenly, the vibrations of the wires 151 with respect to the bus bar substrate 14 can be controlled and also vibrations to be applied to the wires 151 when a car starts suddenly or stops suddenly can be absorbed effectively by the insulated coating members 152, thereby being able to effectively reduce stresses produced in the wires 151, which in turn can eliminate a fear that the wires 151 can be cut.

Figure 3:
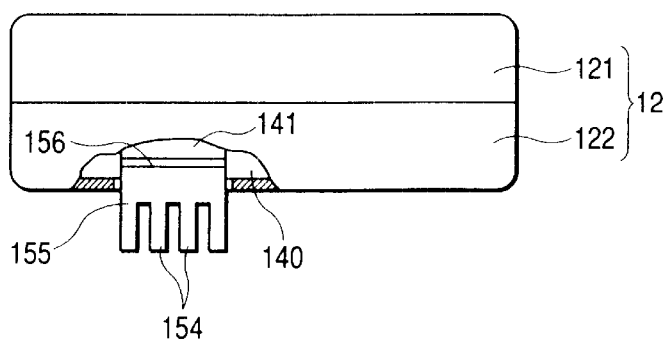
FIG. 3 is a side view of the appearance of the electric connection box shown in FIG. 1.

Also, in the portion of the insulated plate 140, where the bus bar 141 is disposed and also which corresponds to at least the MOSFET 150 position on the back surface of the bus bar 141, there is formed a recessed portion 153 having a depth reaching the bus bar 141; and, in this recessed portion 153, there are disposed a heat radiating member (heat sink) 155 which is made of metal such as aluminum and includes a plurality of fins 154, while the heat radiating member 155 can be contacted with the bus bar 141 through an insulated sheet 156 formed of rubber or ceramics. This heat radiating member 155 is structured such that, as shown in FIG. 3, mainly, the fin 154 portion thereof is exposed to the outside of the insulated case 12. By the way, in case where polymer material such as rubber is used for the insulated sheet 156, it is desirable that filler such as mica having good heat conductivity may be mixed into the polymer material.

Thanks to this, Joule heat generated by the MOSFET 150 when it is driven can be effectively radiated through the heat radiating member 155 into an external space, thereby being able to prevent the temperature of the MOSFET 150 from rising, so that the reliability of the operation of the MOSFET 150 can be enhanced. On the other hand, in case where material such as aluminum nitride having insulating property is used for the heat radiating member 155, it is not necessary to use the insulated sheet 156. ALso, the heat radiating member 155 can also be structured such that it is not exposed to the outside of the insulated case 12; and, in this case as well, it is not necessary to use the insulated sheet 156.

Figure 4:
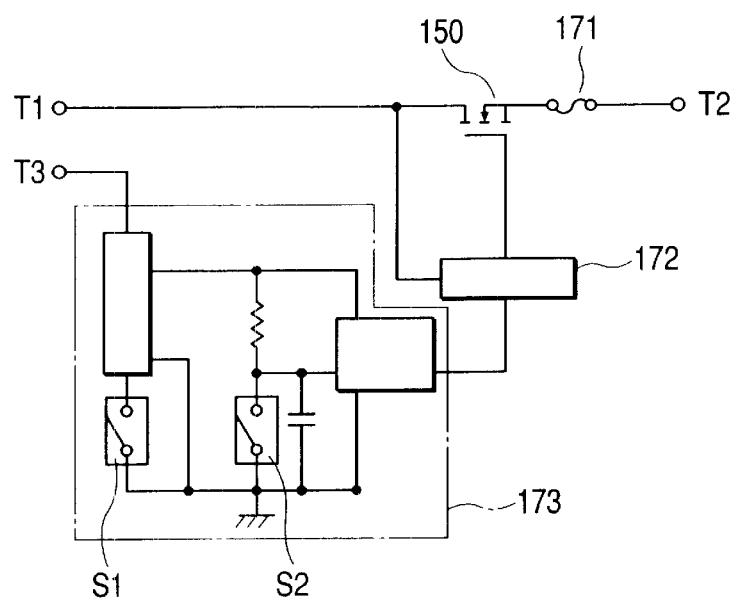
FIG. 4 is a circuit diagram of a circuit employed in the bus bar substrate forming the electric connection box shown in FIG. 1.
Figure 5:
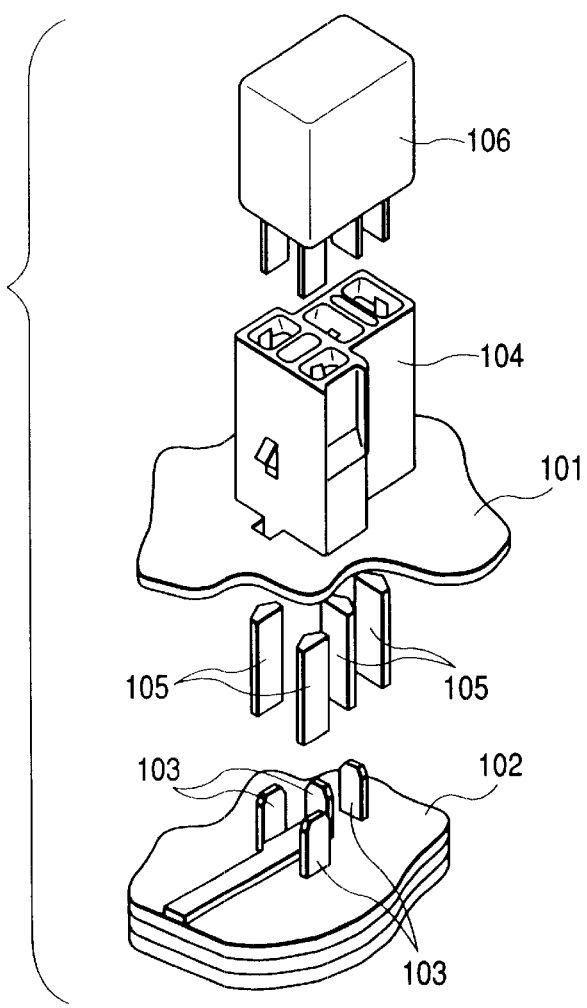
FIG. 5 is an explanatory view of the structure of a conventional electric connection box.

By the way, the bus bar substrate 14 shown in FIG. 2 includes part of such a start circuit for an engine provided in a car as shown in FIG. 4. That is, the start circuit shown in FIG. 4 includes one MOSFET 150, which, together with a fuse 171, is connected between an alternator side terminal T1 and a load side terminal T2, a charge pump 172 for driving this MOSFET 150, and a drive control circuit 173 connected between the charge pump 172 and an igniter side terminal T3 for controlling the operation of the charge pump 172.

In the bus bar substrate 14, in case where two switches (key switches) S1, S2 connected to the interior portion of the drive control circuit 173 are turned on sequentially, the charge pump 172 is driven to thereby turn on the MOSFET 150. These charge pump 172 and control circuit 173 are disposed on, for example, the printed circuit board 145.

In the thus structured electric connection box 10, since the MOSFET 150 is used as switching means and also this MOSFET 150 is surface mounted on the bus bar 141 which is disposed on the surface of the insulated plate 140, the MOSFET 150 and bus bar substrate 14 can be electrically connected to each other on the surface of the bus bar substrate 14 by the wire 151. As a result of this, not only the structure of the bus bar substrate 14 can be simplified to thereby be able to facilitate the assembling the bus bar substrate 14, but also, by changing the connecting position of the wire 151, the bus bar substrate 14 can be easily adapted to a change in the circuit configuration including the MOSFET 150 serving as the switching means.

This can avoid the need to change the shape of the bus bar 141 even when the circuit configuration is changed, thereby being able to eliminate the need for provision of a new metal mold. This not only can prevent the manufacturing cost of the bus bar substrate 14 from increasing but also makes it possible to start a new product (electric connection box) quickly.

By the way, the electric connection box 10 according to the invention is not limited to the structure employed in the above-mentioned embodiment but there are also possible other various changes and modifications which will be described below.

(1) In the above-described embodiment, the electric connection box 10 is structured such that the electronic circuit units 16 are carried on the bus bar substrate 14 in layers or stages. However, according to the invention, the electronic circuit units 16 are not always necessary. Also, even in case where the electronic circuit unit 16 is necessary, it may also be structured in the form of a printed circuit board 145 in which part of a circuit to be configured in the electronic circuit unit 16 is mounted integrally on the surface of the insulated plate 140 which forms a part of the bus bar substrate 14.

(2) In the above-described embodiment, the bus bar substrate 14 is structured such that the printed circuit board 145 is mounted integrally on the insulated plate 140. However, the bus bar substrate 14 can also be structured such that a circuit to be configured on the printed circuit board 145 is formed on the electronic circuit unit 16 and thus the printed circuit board 145 is omitted from the insulated plate 140. In this structure, the source terminal 150b and gate terminal 150c of the MOSFET 150 are both connected to the tab terminals 142 and are thereby connected to the electronic circuit units 16 through the connectors 163.

(3) In the above-described embodiment, the MOSFET 150 is used as the switching means. However, as the switching means, there can also be used various semiconductor switching elements such as a junction FET, a bipolar transistor, or a thyristor. Also, in the above-described embodiment, the MOSFET 150 is made of a bare tip. However, alternatively, an insulated coating member may be formed by molding on the bare tip and a surface-shaped external terminal may be formed on the outer surface of the insulated coating member. Further, as the switching means, there can also be used other switching elements than the semiconductor switching elements.

(4) In the above-described embodiment, on the bus bar 141, there is mounted the heat radiating member 155 as the heat radiating means. However, in case where the calorific power of the MOSFET 150 is small, the heat radiating member 155 is not always necessary. Also, even in case where it is necessary to enhance the heat radiating effect of the bus bar 141, a plurality of small through pores serving as heat radiating means may also be formed in the bus bar 141 so that heat can be radiated through these through pores.

(5) In the above-described embodiment, the MOSFET 150 is connected to the tab terminals 142 by the wire bonder of a thermal pressure bonding type. However, the MOSFET 150 may also be connected to the tab terminals 142, for example, by a wire bonder of an ultrasonically bonding type. In this case, as the wire 151, there can be used an aluminum wire. Also, the MOSFET 150 may not be connected to the bus bar substrate 14 by the wire 151 but may be connected by a plate-shape terminal which can serve as connecting means.

(6) In the above-described embodiment, the MOSFET 150 is surface mounted on the bus bar 141. However, in case where the MOSFET 150 does not include an external terminal on the mounting surface thereof, the MOSFET 150 can also be surface mounted on the insulated plate 140. What is important is that the MOSFET 150 can be surface mounted on the bus bar substrate 14. Even in case where the MOSFET 150 is surface mounted on the insulated plate 140, the MOSFET 150 can be connected to the electronic circuit unit 16 through the wire 151.

(7) In the above-described embodiment, the bus bar substrate 14 is structured such that the bus bars 141 are disposed on the insulated plate 140 while they are divided into a plurality of layers, and also that the bus bar 141 located on the upper-most stage at least in a partial area of the insulated plate 140 is exposed to the surface. However, depending on an electric circuit to be made, the bus bars 141 can also be disposed only on the surface of the insulated plate 140.

(8) In the above-described embodiment, the wire 151 is sealed onto the bus bar substrate 14 by the insulated coating member 152 formed of elastic material such as silicone. However, this is not limitative but, alternatively, the wire 151 may be sealed by hard insulated coating material such as epoxy resin which is not so elastic and, after then, the wire 151 may be bonded and fixed onto the bus bar substrate 14. In this case as well, the vibrations of the wire 151, which are produced when a car starts suddenly or stops suddenly and are applied to the bus bar substrate 14, can be controlled, thereby eliminating a fear that the wire 151 can be cut. Also, the sealing area of the wire 151 must not always be the entire area of the wire 151 but may be only the central portion of the wire 151 or may be only the neighboring area of the connecting portion of the tab terminal of the wire 151.

As has been described heretofore, according to the first aspect of the invention, a switching element to be incorporated into a bus bar circuit through an external terminal is surface mounted on a bus bar substrate, the switching element can be connected to the bus bar substrate by a wire. Thanks to this, not only the structure of the bus bar substrate can be simplified and thus the assembling operation thereof can be facilitated, but also it is possible to realize an electric connection box which is able to cope easily with a change in a circuit configuration.

According to the second aspect of the invention, since the switching element is surface mounted on the bus bar of the bus bar substrate, even when the switching element is capable of generating heat, the heat generated by the switching element can be radiated into an external space through the bus bar, which makes it possible to realize an electric connection box showing excellent operation reliability.

According to the third aspect of the invention, because the external terminal on the mounting surface of the switching element is connected directly to the bus bar, not only the external terminal can be positively connected to the bus bar but also there can be realized an electric connection box which can provide a high heat radiating effect as well as can show excellent operation reliability.

According to the fourth aspect of the invention, since there is disposed, on the bus bar, heat radiating means which radiates heat generated from the switching element into an external space, the generated heat from the switching element can be effectively radiated into the external space, thereby being able to realize an electric connection box which can show more excellent operation reliability.

According to the fifth aspect of the invention, since the heat radiating means is composed of a heat radiating member including a fin and also at least part of the fin is exposed to the outside, the heat generated from the switching element can be radiated more effectively, thereby being able to realize an electric connection box which can show still more excellent operation reliability.

According to the sixth aspect of the invention, the switching element is structured such that at least part of the external terminals are connected to the bus bar substrate by the wires, supply of a drive voltage as well as input and output of an electric signal are carried out through the wires. As a result of this, not only the structure of the bus bar substrate can be simplified and thus the assembling operation thereof can be facilitated, but also it is possible to realize an electric connection box which is able to cope easily with a change in a circuit configuration.

According to the seventh aspect of the invention, at least part of each of the wires, on the bus bar substrate, is sealed by an insulated coating member. This not only can prevent the wires from being cut but also can realize an electric connection box which can show more excellent operation reliability.

According to the eighth aspect of the invention, a print circuit is formed integrally on part of the surface of the bus bar substrate and, to this print circuit, there is connected at least part of the external terminals of the switching element. Due to this, the structure of the bus bar substrate can be simplified to thereby facilitate the assembling of the bus bar substrate as well as a change in the circuit configuration can be easily coped with.

What is claimed is:

1. An electric connection box comprising:
    an insulated case,
    a bus bar substrate including a bus bar circuit thereon and stored in the interior portion of said insulated case, said bus bar circuit being composed of an insulated plate and a bus bar formed of a metal plate and disposed on at least the surface of said insulated plate, and
    a switching element including a plurality of external terminals, wherein said switching element is incorporated into said bus bar circuit by connection through said external terminals in such a state that said switching element is surface mounted on said bus bar substrate and able to accommodate other circuit configurations.

2. The electric connection box as set forth in claim 1, wherein
    said switching element is surface mounted on said bus bar of said bus bar substrate.

3. The electric connection box as set forth in claim 2, wherein
    said switching element includes an external terminal on the mounting surface thereof and said external terminal is connected directly to said bus bar.

4. The electric connection box as set forth in claim 2 wherein
    said bus bar includes heat radiating means for radiating heat generated from said switching element into an external space.

5. The electric connection box as set forth in claim 4, wherein
    said heat radiating means is composed of a heat radiating member including a fin and at least part of said fin is exposed to the outside of said insulated case.

6. The electric connection box as set forth in claim wherein
    said switching element is structured such that at least part of said external terminals are connected to said bus bar substrate through wires respectively.

7. The electric connection box as set forth in claim 6, wherein at least part of each of said wires, on said bus bar substrate, is sealed by an insulated coating member.

8. The electric connection box as set forth in any one of claim 1 wherein
    a print circuit is disposed integrally on part of the surface of said bus bar substrate and at least part of said external terminals of said switching element are connected to said print circuit.

9. The electric connection box as set forth in claim 3, wherein said bus bar includes heat radiating means for radiating heat generated from said switching element into an external space.

10. The electric connection box as set forth in claim 2, wherein said switching element is structured such that as least part of said external terminals are connected to said bus bar substrate through wires respectively.

11. The electric connection box as set forth in claim 3, wherein said switching element is structured such that as least part of said external terminals are connected to said bus bar substrate through wires respectively.

12. The electric connection box as set forth in claim 4, wherein said switching element is structured such that as least part of said external terminals are connected to said bus bar substrate through wires respectively.

13. The electric connection box as set forth in claim 5, wherein said switching element is structured such that as least part of said external terminals are connected to said bus bar substrate through wires respectively.

14. The electric connection box as set forth in claim 2, wherein a print circuit is disposed integrally on part of the surface of said bus bar substrate and at least part of said external terminals of said switching element are connected to said print circuit.

15. The electric connection box as set forth in claim 3, wherein a print circuit is disposed integrally on part of the surface of said bus bar substrate and at least part of said external terminals of said switching element are connected to said print circuit.

16. The electric connection box as set forth in claim 4, wherein a print circuit is disposed integrally on part of the surface of said bus bar substrate and at least part of said external terminals of said switching element are connected to said print circuit.

17. The electric connection box as set forth in claim 5, wherein a print circuit is disposed integrally on part of the surface of said bus bar substrate and at least part of said external terminals of said switching element are connected to said print circuit.

18. The electric connection box as set forth in claim 6, wherein a print circuit is disposed integrally on part of the surface of said bus bar substrate and at least part of said external terminals of said switching element are connected to said print circuit.

19. The electric connection box as set forth in claim 7, wherein a print circuit is disposed integrally on part of the surface of said bus bar substrate and at least part of said external terminals of said switching element are connected to said print circuit.

* * * * *